(12) United States Patent  (10) Patent No.: US 9,153,460 B2
Colgan et al.  (45) Date of Patent: Oct. 6, 2015

(54) HEATSINK ATTACHMENT MODULE

(71) Applicant: International Business Machines Corporation, Armonk, NY (US)

(72) Inventors: Evan G. Colgan, Chestnut Ridge, NY (US); Michael A. Gaynes, Vestal, NY (US); Jeffrey A. Zitz, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 70 days.

(21) Appl. No.: 14/011,218

(22) Filed: Aug. 27, 2013

(65) Prior Publication Data

US 2013/0344660 A1  Dec. 26, 2013

Related U.S. Application Data

(62) Division of application No. 13/284,522, filed on Oct. 28, 2011, now Pat. No. 8,823,164.

(51) Int. Cl.
*H01L 23/00* (2006.01)
*H01L 21/50* (2006.01)
*H01L 23/433* (2006.01)
*H01L 23/31* (2006.01)

(52) U.S. Cl.
CPC .............. *H01L 21/50* (2013.01); *H01L 23/433* (2013.01); *H01L 24/72* (2013.01); *H01L 24/73* (2013.01); *H01L 24/90* (2013.01); *H01L 24/92* (2013.01); *H01L 23/3128* (2013.01); *H01L 24/16* (2013.01); *H01L 24/32* (2013.01); *H01L 2224/131* (2013.01); *H01L 2224/16225* (2013.01); *H01L 2224/32225* (2013.01); *H01L 2224/73253* (2013.01); *H01L 2224/81815* (2013.01); *H01L 2224/83104* (2013.01); *H01L 2224/83901* (2013.01); *H01L 2224/921* (2013.01); *H01L 2924/10253* (2013.01)

(58) Field of Classification Search
CPC .......... H01L 24/72; H01L 24/32; H01L 24/16
See application file for complete search history.

(56) References Cited

U.S. PATENT DOCUMENTS

| | | |
|---|---|---|
| 5,545,473 A | 8/1996 | Ameen et al. |
| 5,724,230 A | 3/1998 | Poetzinger |
| 6,333,551 B1 | 12/2001 | Caletka et al. |
| 6,404,638 B1 | 6/2002 | Messina |
| 6,449,162 B1 | 9/2002 | Corbin, Jr. et al. |
| 6,504,723 B1 | 1/2003 | Fitzgerald et al. |

(Continued)

FOREIGN PATENT DOCUMENTS

WO  03030256 A2  10/2003

OTHER PUBLICATIONS

International Search Report and Written Opinion for International Application No. PCT/US12/59478; International Filing Date: Oct. 28, 2011; Date of mailing Jan. 8, 2013. 13 pages.

*Primary Examiner* — Amar Movva
(74) *Attorney, Agent, or Firm* — Cantor Colburn LLP; Louis Percello

(57) ABSTRACT

An assembly process for a heatsink attachment module for a chip packaging apparatus is provided and includes attaching a semiconductor chip to a substrate to form a module subassembly, placing a load frame and shim in a fixture, dispensing adhesive to the load frame and loadably placing the module subassembly chip face down in the fixture.

12 Claims, 10 Drawing Sheets

(56) References Cited

U.S. PATENT DOCUMENTS

| | | |
|---|---|---|
| 6,748,350 B2 | 6/2004 | Rumer et al. |
| 6,828,676 B2 | 12/2004 | Akai |
| 6,848,172 B2 | 2/2005 | Fitzgerald et al. |
| 6,894,908 B1 | 5/2005 | Clark et al. |
| 6,936,501 B1 | 8/2005 | Too et al. |
| 6,965,171 B1 | 11/2005 | Lee et al. |
| 7,102,226 B2 | 9/2006 | Fitzgerald et al. |
| 7,119,433 B2 | 10/2006 | Corbin, Jr. et al. |
| 7,185,420 B2 | 3/2007 | Mayer |
| 7,256,058 B2 | 8/2007 | Fitzgerald et al. |
| 7,312,261 B2 | 12/2007 | Sachdev et al. |
| 7,440,281 B2 | 10/2008 | Bailey et al. |
| 7,480,143 B2 | 1/2009 | Delano et al. |
| 7,506,795 B2 | 3/2009 | Mayer |
| 7,513,035 B2 | 4/2009 | Too et al. |
| 7,518,235 B2 | 4/2009 | Coico et al. |
| 7,547,582 B2 | 6/2009 | Brunschwiler et al. |
| 7,606,033 B2 | 10/2009 | Colbert et al. |
| 7,616,444 B2 | 11/2009 | Munch et al. |
| 7,733,655 B2 | 6/2010 | Beaumier et al. |
| 7,826,228 B2 | 11/2010 | Audet et al. |
| 2005/0037640 A1 | 2/2005 | Messina et al. |
| 2005/0108877 A1 | 5/2005 | Peterson |
| 2005/0127500 A1 | 6/2005 | Colgan et al. |
| 2008/0081489 A1 | 4/2008 | MacGregor et al. |
| 2009/0034198 A1 | 2/2009 | Colbert et al. |
| 2009/0284921 A1 | 11/2009 | Colgan et al. |
| 2011/0012259 A1 | 1/2011 | Grinman et al. |
| 2011/0075377 A1 | 3/2011 | Paquette et al. |

HEATSINK ATTACHMENT MODULE

CROSS REFERENCE TO RELATED APPLICATION

This application is a Divisional Application of U.S. Non-Provisional application Ser. No. 13/284,522, which was filed Oct. 28, 2011. The entire contents of U.S. application Ser. No. 13/284,522 are incorporated herein by reference.

BACKGROUND

The present invention relates to a heatsink attachment module and, more particularly, to a thermal interface material (TIM) gap control for a direct heatsink attachment module.

In the packaging of semiconductor chips, an organic substrate is typically used. The organic substrate fans out the fine pitch, typically 0.15 to 0.2 mm, controlled collapse chip connection (C4) solder bumps on the silicon die to larger pitch, typically 1.0 to 1.2 mm, ball grid array (BGA) or land grid array (LGA) connections. With a BGA, the chip package is attached to a printed circuit board by the reflow of the solder balls to form a permanent connection. An LGA type interposer provides a connection where the chip package can be readily removed and replaced on the printed circuit board (PCB).

In general, with an organic packaging substrate, a lid formed from a thermally conductive material, such as copper, is attached to the chip and the organic substrate to protect the chip during handling and to add mechanical strength to the organic substrate. A thermal interface material (TIM) material is dispensed between the back surface of the chip and the lid to provide a thermal path for heat dissipation. If required, a heat sink is then attached using a second TIM layer to the outside surface of the lid. The chip is mounted face, or device side, down on the packaging substrate. When used with an LGA interposer, where a compressive load through the chip, the LGA and the PCB is required for electrical contact, the load is applied to the package lid either in the center above the chip or at two or more points on the perimeter. Due to the differences in thermal expansion coefficient between the organic substrate, the chip and the lid, unique assembly processes for the above-described operations may be required.

For multichip modules (MCMs) on ceramic substrates, to improve the thermal performance, it is often desirable to customize the lid so that a thin uniform TIM layer can be provided on multiple chips, independent of chip tilt or height variations. A previous method to achieve this has involved customizing the location of cylindrical holding elements by placing shims on the chips and reflowing solder to secure the holding elements to the inner surface and edges of the openings. When a lid is used, the cooling path for the chip contains two TIM layers, one on the chip side of the lid and a second between the lid and the heat sink. For some applications, this can be an unacceptable limitation.

For high performance computing, there has been significant development work on various types of chip stacks as it is becoming increasingly difficult to further improve device performance by scaling down the dimensions. In some chip stacks, the chips are thinned down to enable the fabrication of fine pitch thru silicon vias (TSV), which can reduce the mechanical strength of the chips, so it may be desirable to not provide the actuation load for an LGA through the chip stack, especially as the size of the substrate, and hence the required load, increases. For applications with a high power density, or which require a low junction operating temperature, a packaging solution where the heat sink can be directly attached to the back surface of the chip or chip stack may be required. The use of only a single TIM layer between the chip or chip stack and the heat sink results in improved thermal performance compared to a lidded chip package where two TIM layers are required. This is typically referred to as a lidless or direct heat sink attach package. For high performance systems, it is generally desirable to use LGA chip packages instead of BGA chip packages so that the chip can be replaced if necessary. As the chip complexity increases and the power and input/output (I/O) requirements grow, the size of the package generally increases to provide a greater number of LGA contacts. For a lidless package where the LGA actuation load is provided through the chip, the substrate, or the combination of the substrate and top surface stiffener, there is a need to provide enough mechanical rigidity to distribute the load with sufficient uniformity across the LGA interposer to form electrical contact for all the pads. For organic substrates, this may limit the allowable substrate size and for ceramic substrates this may increase the required thickness. When the LGA actuation load is provided to the substrate, a load frame (or stiffener) with an opening for the chip, may be attached to the substrate and the combined structure needs to provide adequate mechanical stiffness to actuate the LGA uniformly. Such a load frame, or stiffener, would be attached to the substrate.

SUMMARY

According to an aspect of the invention, a chip packaging apparatus includes a substrate, a load frame attached to the substrate by an adhesive material, the load frame being formed to define an aperture and a semiconductor chip mounted on the substrate within the aperture. A thickness of the adhesive material between the load frame and the substrate is varied and adjusted such that a surface of the load frame opposite the substrate is disposed substantially in parallel to a surface of the chip opposite the substrate.

According to another aspect of the invention, a chip packaging apparatus is provided and includes a substrate, a load frame attached to the substrate by an adhesive material, the load frame being formed to define an aperture and a semiconductor chip mounted on the substrate within the aperture. A thickness of the adhesive material between the load frame and the substrate is varied and adjusted such that a surface of the load frame opposite the substrate is disposed substantially in parallel to a surface of the chip opposite the substrate, and the surface of the chip is offset below the surface of the load frame.

According to yet another aspect of the invention, an assembly process for a heatsink attachment module for a chip packaging apparatus is provided. The process includes attaching a semiconductor chip to a substrate to form a module subassembly, placing a load frame and shim in a fixture, dispensing adhesive to the load frame, loadably placing the module subassembly chip face down in the fixture and curing the adhesive.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

A heatsink attachment module is disclosed and provides a load frame attached to a $1^{st}$ level package substrate (organic or ceramic) where a top surface of the load frame is disposed in parallel with a back surface of the chip and is vertically offset above the back surface of the chip by a controlled distance.

Figure 1:
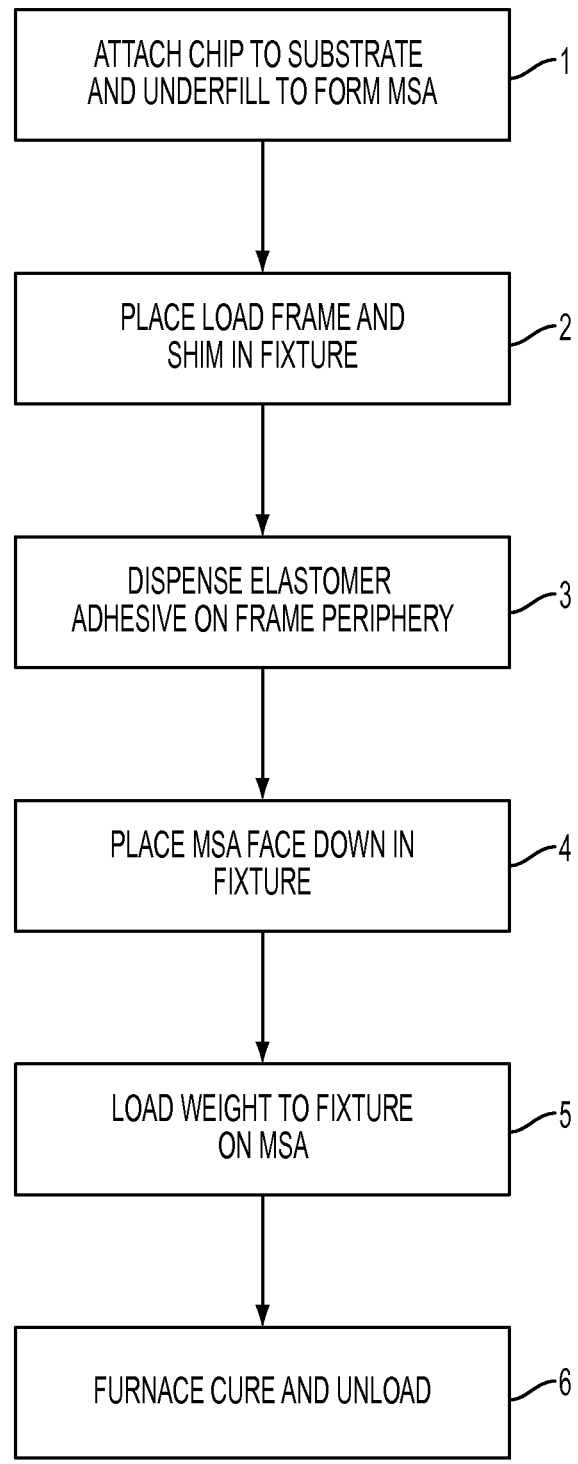
FIG. 1 is a flow diagram illustrating an assembly process for a heatsink attachment module.
Figure 2:
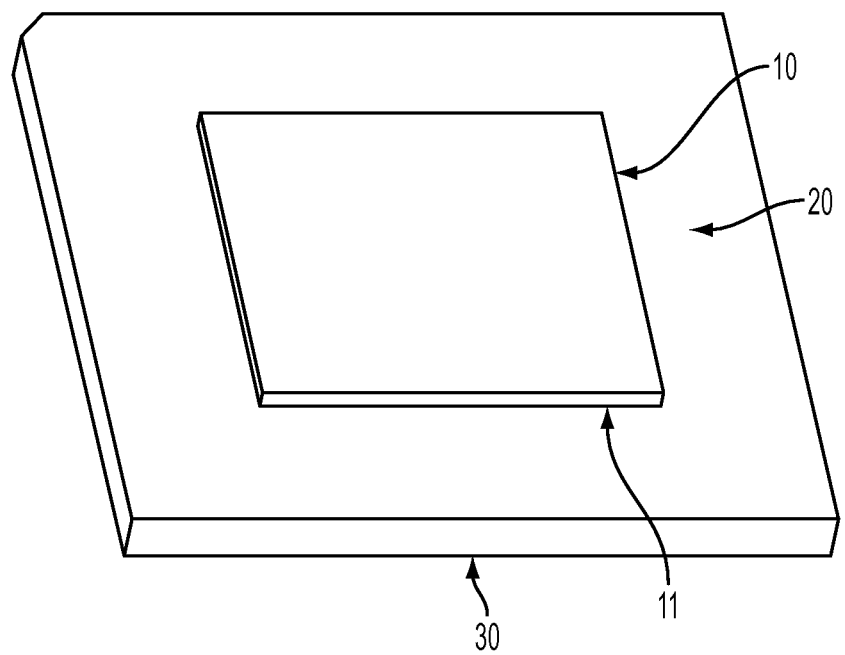
FIG. 2 is a perspective view of a chip mounted on substrate.

With reference to FIGS. 1 and 2, a first operation (operation 1) for forming the heatsink attachment module is illustrated and includes an attachment of a chip 10, such as a microprocessor, to a substrate 20 or carrier. This operation is accomplished by a two-stage process. In the first stage, controlled collapse chip connections (C4s), such as fine pitch solder balls, are reflowed on the chip active surface 11 to connect the chip 10 to a matching set of pads on the substrate 20. In the second stage, underfilling of the chip 10 is conducted with a suitable underfill of, for example, polymer material. This forms a module subassembly (MSA) 30.

Figure 3:
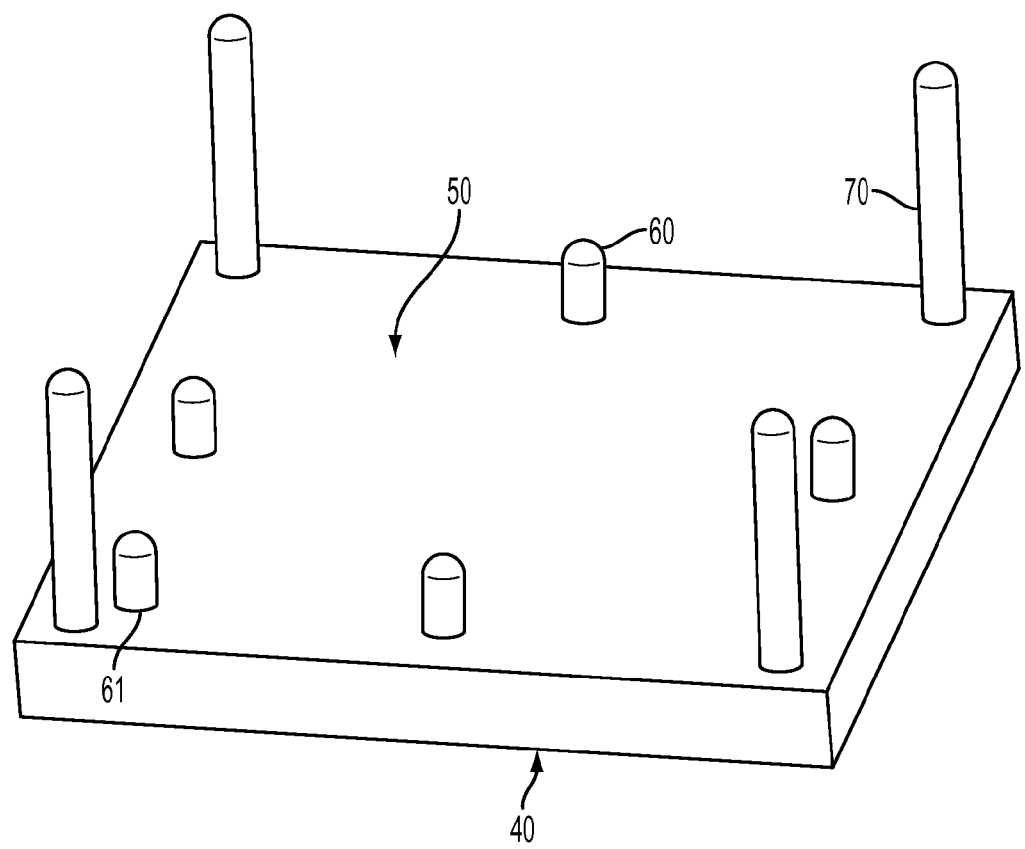
FIG. 3 is a perspective view of a fixture to which a module is assembled.

With reference to FIG. 3, a fixture 40 is provided. The fixture 40 includes a substantially flat upper surface 50 from which inner alignment pins 60 and outer alignment pins 70 extend. The inner alignment pins 60 have a first length and are disposed to position the load frame (which is described below) and the MSA 30. The outer alignment pins 70 have a second length, which may be longer than the first length, and are disposed to center the load plate (which is described below) on the MSA 30. The inner alignment pins 60 further include at least 1 positioning pin 61, which is disposed to position at least the load frame as described below.

Figure 4:
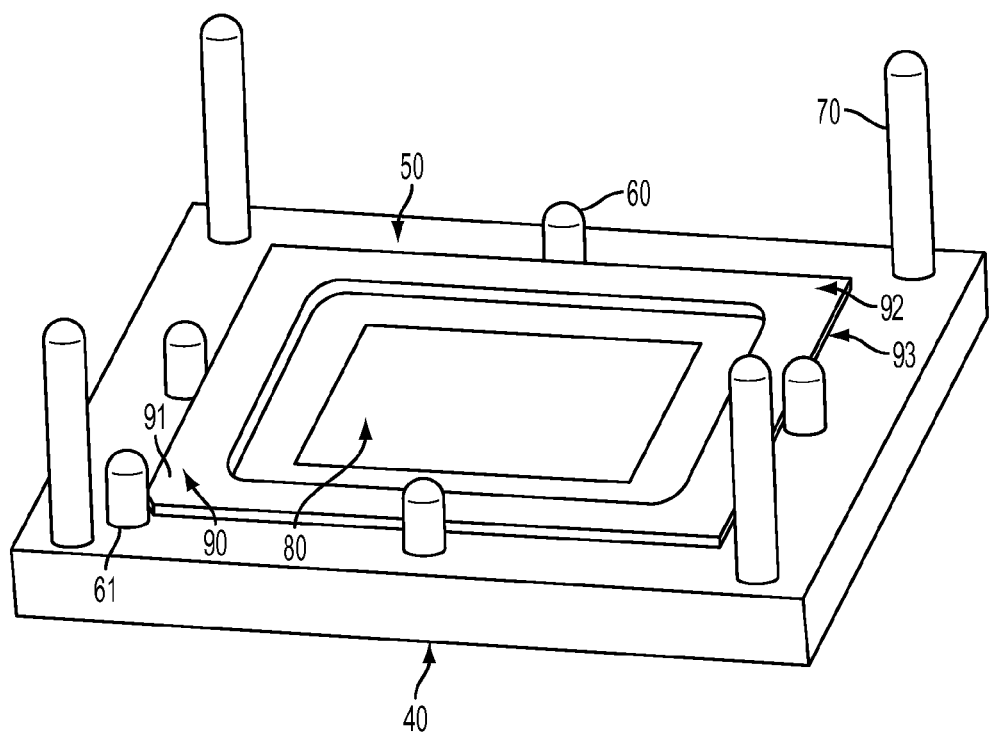
FIG. 4 is a perspective view of the fixture with a shim and a load ring in place.

With reference to FIGS. 1 and 4, in a next operation (operation 2) in the process, a shim 80 and the load frame 90 are placed in the fixture 40. The shim 80 is placed in an inner region of the upper surface 50 at a position underneath the position where the chip 10 will be after the MSA 30 is placed as described below. The load frame 90 fits within the inner alignment pins 60 and includes a corner portion 91 that abuts the positioning pin 61. The load frame 90 includes substantially flat and substantially parallel major surfaces 92 (i.e., the top surface) and 93 (i.e., the bottom surface).

The inner alignment pins 60 are designed and positioned to accurately locate the load plate. The positioning pin 61 is disposed in a corner position and is provided to prevent accidental rotation of the load frame 90 or the MSA 30.

Figure 5:
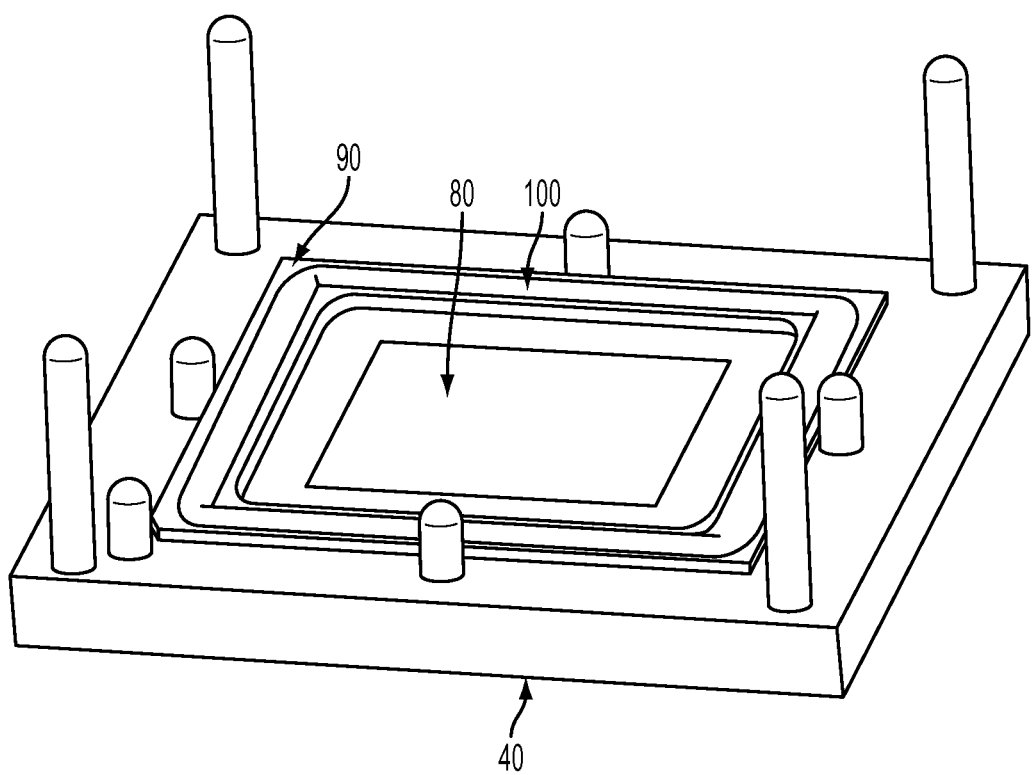
FIG. 5 is a perspective view of the fixture after adhesive material has been dispensed on the load ring.
Figure 6:
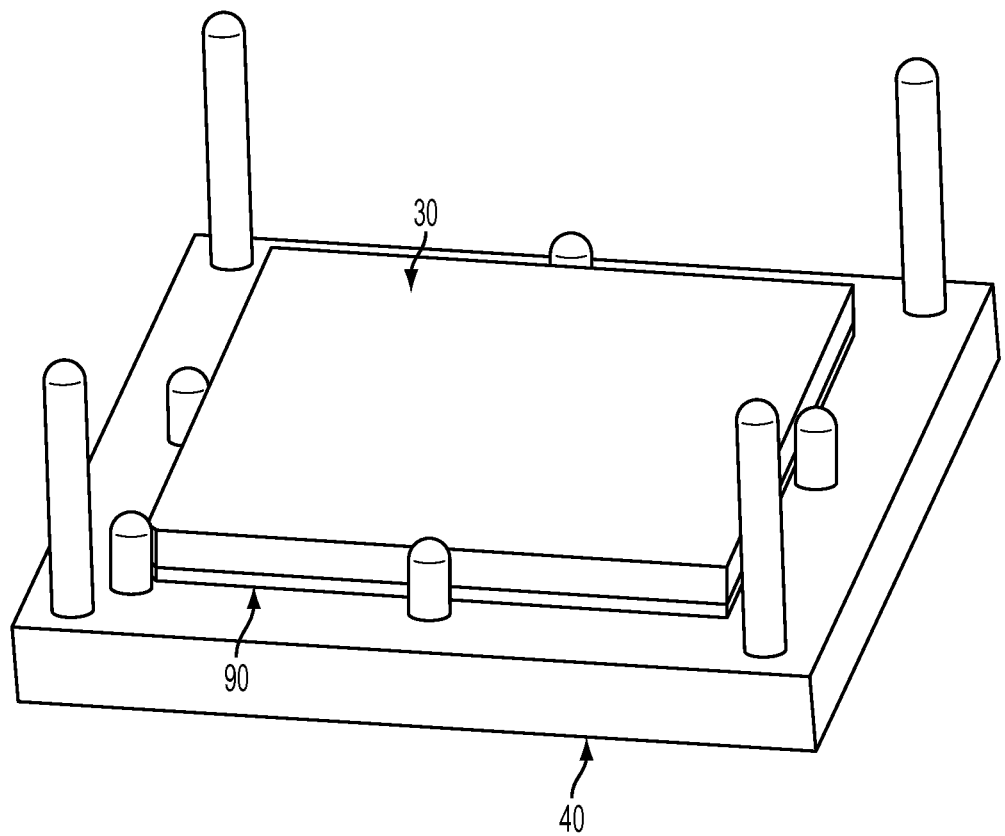
FIG. 6 is a perspective view of the fixture after the substrate with the chip attached has been added.

With reference to FIGS. 1, 5 and 6, a polymer adhesive 100 is dispensed on the load frame 90 (operation 3). The polymer adhesive 100 may include one or more suitable adhesives, including but not limited to Sylgard 577 or EA6700, for example. In accordance with embodiments, a bead of the polymer adhesive 100 is dispensed on the load frame 90 and wets both mating surfaces upon assembly. As shown in FIG. 6, the MSA 30 is then aligned chip 10 side down to the load frame 90 by the fixture 40 and pressed against the shim 80 (operation 4).

Figure 7:
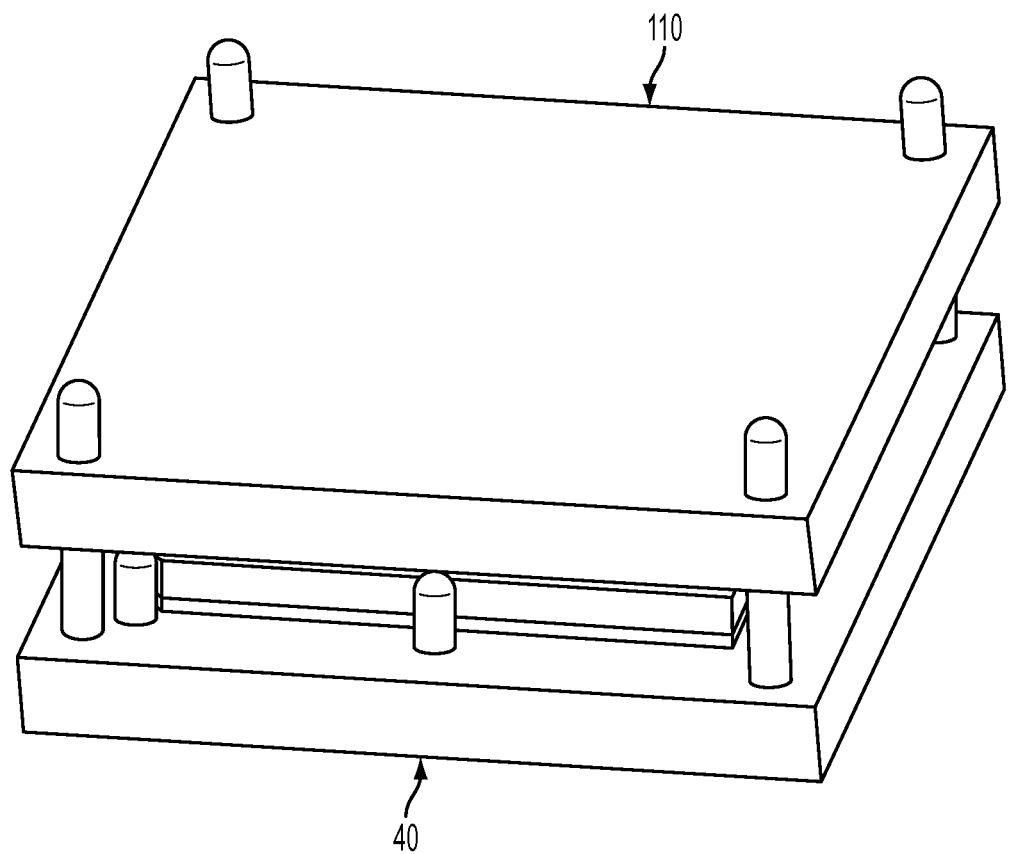
FIG. 7 is a perspective view of the fixture after the load plate has been added.
Figure 8:
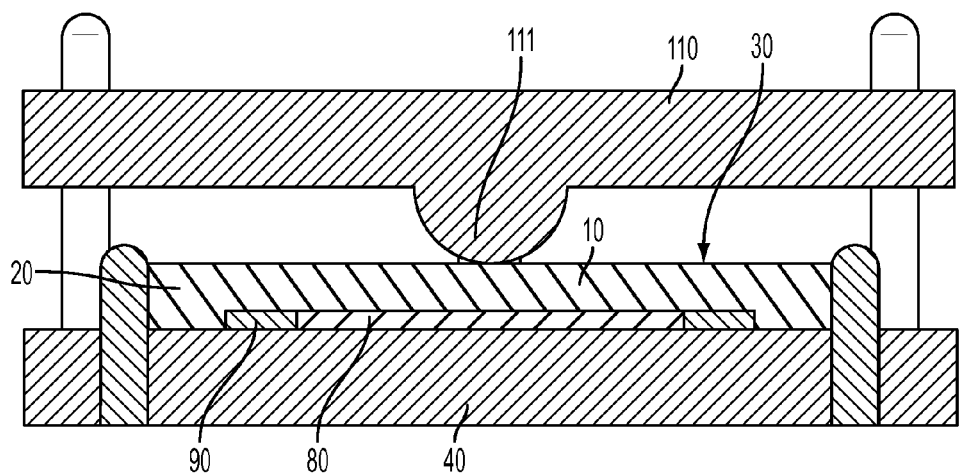
FIG. 8 is a cross-sectional view of the loaded fixture.

With reference to FIGS. 1, 7 and 8, a load plate 110 is then aligned with the fixture 40 and placed thereon (operation 5). The alignment between the load plate 110 and the fixture 40 is provided by at least the outer alignment pins 70, which extend through corresponding holes defined in the load plate 110. When the load plate 110 is placed on the fixture 40 in this manner, the load plate 110 provides a compressive force on the substrate 20 behind a center of the chip 10. As shown in FIG. 8, the load plate 110 includes a rounded portion 111, which protrudes downwardly from a lower surface of the load plate 110 and which may be positioned behind the center of the chip 10. The rounded portion 111 thus protrudes downwardly from the load plate 110 and compresses the chip 10 toward the substrate 20 in such a manner as to substantially insure that the MSA 30 is aligned to the load frame 90 and pressed against the shim 80.

Figure 9:
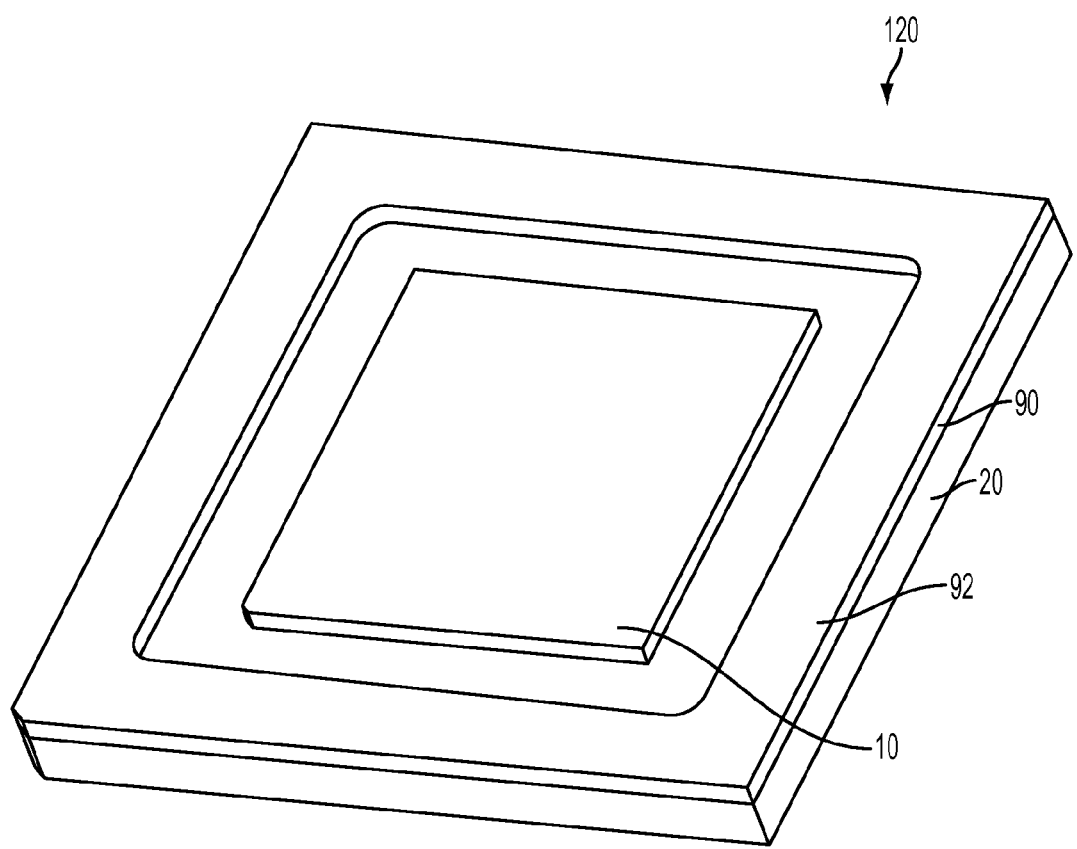
FIG. 9 is a perspective view of a completed module.

With reference to FIGS. 1 and 9, a heat curing operation (operation 6) is conducted to cure the polymer adhesive 100 in, for example, a furnace or oven. After cooling down, the completed module 120 is removed from the fixture 40, as shown in FIG. 9. The removal of the completed module 120 from the fixture 40 results in the load frame 90 being attached to the substrate 20 such that the major surface 92 (i.e., the top, exposed surface) of the load frame 90 is disposed substantially in parallel to the back surface of the chip 10 and such that a plane of the major surface 92 is vertically offset from a plane of the back surface of chip 10 by a distance, which is substantially equal to a thickness of the shim 80. In accordance with embodiments, a nominal thickness of the seal band (i.e., the polymer adhesive 100) plus a thickness of the load frame 90 may be substantially equal to the chip 10, or chip stack, height above the substrate 20 plus the thickness of the shim 80.

Figure 10:
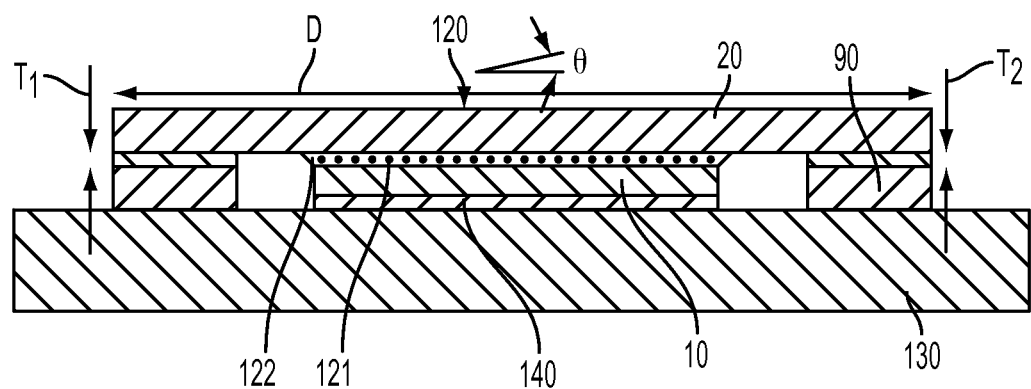
FIG. 10 is a cross-sectional view of the completed module on a flat heat sink surface with a TIM layer applied.

With reference to the cross-sectional view of the completed module 120 of FIG. 10, the C4 bumps 121 (i.e., micro solder bumps) and the underfill material 122 are shown as being disposed between the chip 10 and the substrate 20. For a ceramic substrate 20, the typical adhesive seal band thickness is about 80 to 100 microns and for an organic substrate 20, the typical adhesive seal band thickness is about 180 to 200 microns. The seal band thicknesses are labeled $T_1$ and $T_2$ in FIG. 10. For both substrate materials, the minimum acceptable seal band thickness is about 10 microns.

After joining the chip 10 to the substrate 20, the maximum typical chip tilt value is about 0.1°, where this is the angle between the plane formed by the surface of the substrate 20 and the back (non-active) chip 10 surface. To achieve the best possible thermal performance, it may be necessary to establish a thin and uniform TIM layer. For a lidless module, if a load plate/stiffener 90 was used which was parallel with the substrate 20 instead of with the chip 10 and the heat sink 130 was parallel with this, then for a 25×30 mm chip (about 39 mm diagonal size) with a 0.1° chip tilt along the diagonal, the height difference between the two diagonal chip corners would be about 39 mm×tan(0.1°)=68 microns. A typical TIM bond line may be only 20-30 microns, so such a tilt could dramatically increase the thermal resistance from the chip 10 to the heat sink.

With reference to FIG. 10, the difference in seal band thickness $T_2-T_1$ is equal to the value of D, which is the width of the substrate 20, multiplied by $\tan(\theta)$. As mentioned above, with a ceramic substrate 20 the typical seal band thickness is about 100 microns and the minimum acceptable thickness is about 10 microns, so the allowable reduction of the typical thickness is about 90 microns. If we assume that the seal band thickness can also be increased by 90 microns above the typical value to 190 microns total, with a maximum chip 10 tilt of $\theta=0.1°$, then the corresponding value of D would be about 103 mm. If this is the diagonal of a square substrate, the length of each side would be about 73 mm. A typical ceramic single chip, or dual chip, module is about 50 mm on a side, so with the above assumptions, this structure can be applied to the majority of ceramic single chip or dual chip module designs. With organic substrates 20, where the nominal seal band thickness is greater, this structure can be applied to even larger substrate sizes, assuming the maximum seal band thickness, of about 400 microns, is not limiting. As noted earlier, the TIM layer 140 between the back surface of the chip and the flat surface of the heat sink 130 will be substantially equal in thickness to the shim 80 which was used in assembly and substantially uniform across the surface of the chip 10. The flat surface of the heat sink 130 can be used to apply the LGA actuation load to the load frame 90 to electrically connect the completed module 120 through an LGA interposer to a printed circuit board.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagram depicted herein is just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. An assembly process for a heatsink attachment module for a chip packaging apparatus, the process comprising:
    attaching a semiconductor chip to a substrate to form a module subassembly;
    placing a load frame and shim in a fixture;
    dispensing adhesive to the load frame;
    loadably placing the module subassembly chip face down in the fixture; and
    curing the adhesive.

2. The process according to claim 1, wherein the loadably placing comprises loading the module subassembly with a load plate having a rounded portion protruding into a center of the chip.

3. The process according to claim 1, wherein the adhesive material comprises a polymer material.

4. The process according to claim 1, wherein the dispensing comprising dispensing the adhesive material to have a thickness between about 10-400 microns.

5. The process according to claim 1, wherein the dispensing comprising dispensing the adhesive material to have a thickness between about 10-190 microns.

6. The process according to claim 1, wherein the substrate comprises ceramic material.

7. The process according to claim 1, wherein the substrate comprises organic material.

8. The process according to claim 1, further comprising offsetting a surface of the chip opposite the substrate from a surface of the load frame.

9. The process according to claim 1, further comprising:
    disposing a heat sink above the chip; and
    interposing a thermal interface material (TIM) between the heat sink and the chip.

10. The process according to claim 9, wherein the interposing comprises providing the TIM with a substantially uniform thickness.

11. The process according to claim 9, wherein the interposing comprises providing the TIM with a thickness approximately equal to a offset of a surface of the chip and a surface of the load frame.

12. An assembly process for a heatsink attachment module for a chip packaging apparatus, the process comprising:
    attaching a semiconductor chip to a substrate to form a module subassembly;
    placing a load frame and shim in a fixture;
    dispensing adhesive to the load frame; and
    loadably placing the module subassembly chip face down in the fixture.

* * * * *